(12) United States Patent
Breitwisch et al.

(10) Patent No.: US 8,492,194 B2
(45) Date of Patent: *Jul. 23, 2013

(54) CHEMICAL MECHANICAL POLISHING STOP LAYER FOR FULLY AMORPHOUS PHASE CHANGE MEMORY PORE CELL

(75) Inventors: Matthew J. Breitwisch, Yorktown Heights, NY (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

This patent is subject to a terminal disclaimer.

(21) Appl. No.: 13/102,550

(22) Filed: May 6, 2011

(65) Prior Publication Data

US 2011/0210307 A1 Sep. 1, 2011

Related U.S. Application Data

(62) Division of application No. 12/550,062, filed on Aug. 28, 2009, now Pat. No. 8,012,790.

(51) Int. Cl.
*H01L 21/06* (2006.01)
*H01L 21/108* (2006.01)
*H01L 21/44* (2006.01)
*H01L 21/20* (2006.01)

(52) U.S. Cl.
USPC ............ 438/95; 438/634; 257/5; 257/E21.52; 257/E45.002

(58) Field of Classification Search
None
See application file for complete search history.

(56) References Cited

U.S. PATENT DOCUMENTS

| 5,118,299 A | 6/1992 | Burns et al. |
| 5,687,112 A | 11/1997 | Ovshinsky |
| 5,789,277 A | 8/1998 | Zahorik et al. |
| 5,825,046 A | 10/1998 | Czubatyj et al. |
| 5,903,059 A | 5/1999 | Bertin et al. |
| 5,956,575 A | 9/1999 | Bertin et al. |
| 6,087,674 A | 7/2000 | Ovshinsky et al. |
| 6,150,253 A | 11/2000 | Doan et al. |
| 6,177,329 B1 | 1/2001 | Pang |

(Continued)

FOREIGN PATENT DOCUMENTS

| EP | 1830362 A2 | 9/2007 |
| WO | 2009115995 A1 | 9/2009 |

OTHER PUBLICATIONS

International Search Report; International Application No. PCT/EP2010/066131; International Filing Date: Oct. 26, 2010; Date of Mailing: Jan. 19, 2011.

(Continued)

*Primary Examiner* — Thomas L Dickey
*Assistant Examiner* — Joseph Schoenholtz
(74) *Attorney, Agent, or Firm* — Cantor Colburn LLP; Vazken Alexanian (57) ABSTRACT

A method for fabricating a phase change memory pore cell that includes forming a bottom electrode, forming a dielectric layer on the bottom electrode, and forming a sacrificial layer on the dielectric layer. The method further includes selectively etching portions of the sacrificial layer and the dielectric layer to define a pore extending through the sacrificial layer and the dielectric layer, depositing phase change material on the sacrificial layer and into the pore and removing the phase change material formed outside the pore, removing the sacrificial layer to expose the pore, the pore being vertically aligned, and forming a top electrode over the pore.

16 Claims, 6 Drawing Sheets

U.S. PATENT DOCUMENTS

| | | |
|---|---|---|
| 6,393,685 B1 | 5/2002 | Collins |
| 6,512,241 B1 | 1/2003 | Lai |
| 6,744,088 B1 | 6/2004 | Dennison |
| 6,750,469 B2 | 6/2004 | Ichihara et al. |
| 6,791,102 B2 | 9/2004 | Johnson et al. |
| 6,797,612 B2 | 9/2004 | Zahorik |
| 7,026,213 B1 | 4/2006 | Lee |
| 7,057,923 B2 | 6/2006 | Furkay et al. |
| 7,224,068 B2 | 5/2007 | Tseng et al. |
| 7,324,365 B2 | 1/2008 | Gruening-von Schwerin et al. |
| 7,362,608 B2 | 4/2008 | Schwerin et al. |
| 7,394,088 B2 | 7/2008 | Lung |
| 7,397,060 B2 | 7/2008 | Lung |
| 7,423,300 B2 | 9/2008 | Lung et al. |
| 7,473,576 B2 | 1/2009 | Lung |
| 7,476,587 B2 | 1/2009 | Lung |
| 7,485,487 B1 | 2/2009 | Breitwisch et al. |
| 7,545,668 B2 | 6/2009 | Philipp et al. |
| 7,547,913 B2 | 6/2009 | Yoon et al. |
| 7,560,721 B1 | 7/2009 | Breitwisch et al. |
| 7,582,889 B2 | 9/2009 | Asano |
| 7,718,464 B2 * | 5/2010 | Zaidi .................. 438/95 |
| 7,808,816 B2 | 10/2010 | Tanaka et al. |
| 7,863,593 B2 * | 1/2011 | Happ et al. ............. 257/2 |
| 7,879,645 B2 | 2/2011 | Lung et al. |
| 7,927,911 B2 | 4/2011 | Breitwisch et al. |
| 8,012,790 B2 * | 9/2011 | Breitwisch et al. ........ 438/95 |
| 8,030,130 B2 | 10/2011 | Breitwisch et al. |
| 8,189,372 B2 * | 5/2012 | Breitwisch et al. ........ 365/163 |
| 2001/0032702 A1 | 10/2001 | Feldman et al. |
| 2002/0023581 A1 | 2/2002 | Vodakov et al. |
| 2004/0077123 A1 | 4/2004 | Lee et al. |
| 2004/0179394 A1 | 9/2004 | Ovshinsky et al. |
| 2004/0195604 A1 | 10/2004 | Hwang et al. |
| 2005/0180191 A1 | 8/2005 | Xu |
| 2005/0263829 A1 | 12/2005 | Song et al. |
| 2006/0175597 A1 | 8/2006 | Happ |
| 2006/0175599 A1 | 8/2006 | Happ |
| 2007/0010082 A1 | 1/2007 | Pinnow et al. |
| 2007/0018202 A1 | 1/2007 | Zhu |
| 2007/0029606 A1 | 2/2007 | Noh et al. |
| 2007/0034849 A1 | 2/2007 | Sandoval et al. |
| 2007/0108488 A1 | 5/2007 | Suh et al. |
| 2007/0155117 A1 | 7/2007 | Wicker |
| 2007/0158395 A1 | 7/2007 | Fasano et al. |
| 2007/0166981 A1 | 7/2007 | Furukawa et al. |
| 2007/0184233 A1 | 8/2007 | Meinders et al. |
| 2007/0197012 A1 | 8/2007 | Yang et al. |
| 2007/0246440 A1 | 10/2007 | Sato |
| 2007/0246782 A1 | 10/2007 | Philipp et al. |
| 2007/0249086 A1 | 10/2007 | Philipp et al. |
| 2007/0252127 A1 | 11/2007 | Arnold et al. |
| 2008/0023685 A1 | 1/2008 | Czubatyj et al. |
| 2008/0061341 A1 | 3/2008 | Lung |
| 2008/0137400 A1 | 6/2008 | Chen et al. |
| 2008/0138931 A1 | 6/2008 | Lung |
| 2008/0164452 A1 | 7/2008 | Joseph et al. |
| 2008/0178436 A1 | 7/2008 | Zhang et al. |
| 2008/0191187 A1 | 8/2008 | Lung et al. |
| 2008/0197333 A1 | 8/2008 | Lung |
| 2008/0203379 A1 | 8/2008 | Magistretti et al. |
| 2008/0246014 A1 | 10/2008 | Lung |
| 2008/0265234 A1 * | 10/2008 | Breitwisch et al. ........ 257/2 |
| 2008/0265239 A1 * | 10/2008 | Philipp et al. ............. 257/4 |
| 2008/0286446 A1 | 11/2008 | Kamepalli et al. |
| 2008/0316794 A1 | 12/2008 | Philipp et al. |
| 2009/0072216 A1 | 3/2009 | Lung et al. |
| 2009/0149006 A1 | 6/2009 | Kim |
| 2009/0185411 A1 | 7/2009 | Happ et al. |
| 2009/0196094 A1 * | 8/2009 | Breitwisch et al. ........ 365/163 |
| 2009/0242865 A1 | 10/2009 | Lung et al. |
| 2011/0049460 A1 | 3/2011 | Breitwisch et al. |

OTHER PUBLICATIONS

International Search Report—Written Opinion; International Application No. PCT/EP2010/066131; International Filing Date: Oct. 26, 2010; Date of Mailing: Jan. 19, 2011.

Y.N. Hwang et al., "Phase-Change Chalcogenide Nonvolatile RAM Completely Based on CMOS Technology,"2003 International Symposium on VLSI Technology, Systems, and Applicatons (IEEE), Oct. 6-8, 2003. pp. 29-31.

U.S. Appl. No. 13/004,471; Non-Final Office Action; Date Filed: Jan. 11, 2011; Date Mailed: Jun. 8, 2012; pp. 1-21.

International Search Report; International Application No. PCT/US10/43631; International Filing Date: Jul. 29, 2010; Date of Mailing: Sep. 23, 2010.

International Search Report—Written Opinion—International Application No. PCT/US10/43631; International Filing Date: Jul. 29, 2010; Date of Mailing: Sep. 23, 2010.

Y.C. Chen et al.; "Ultra-Thin Phase-Change Bridge Memory Device Using GeSb;" Electron Device Meeting 2006; pp. 1-3.

Der-Sheng Chao et al., "Low Programming Current Phase Change Memory Cell with Double GST Thermally Confined Structure," VLSI Technology, 2006, Systems and Applications, 2007, VLSI-TSA 2007, International Symposium on; Apr. 23-25, 2007 pp. 1-2.

Notification of Transmittal of the International Search Report and The Written Opinion of the International Searching Authority, or the Declaration; date of mailing Jan. 10, 2011; PCT/US2010/056174.

Written Opinion of the International Searching Authority (PCT); date of mailing Jan. 10, 2011; PCT/US2010/056174.

M. Breitwisch et al., "Novel Lithography-Independent Pore Phase Change Memory," IEEE Symposium on VLSI Technology, 2007.

B. Rajendran et al., "On the Dynamic Resistance and Reliability of Phase Change Memory," Symposium on VLSI Technology; 2008.

S. Raoux et al., "Phase-change random access memory: A scalable technology", IBM J Res. & Dev. vol. 52. 4/5 Jul./Sep. 2008 pp. 465-479.

Xiu-Lan Cheng et al., "Simulation on A Novel Ga-doped Phase Change Memory for Next Generation Embedded Non-Volatile Memory Application," 2008 IEEE/SEMI Advanced Semiconductor Manufacturing Conference, pp. 43-48.

Song, Y.J. et al., "Advanced ring type contact technology for high density phase chane menory," Solid-State Device Research Conference, 2005, ESSDERC 2005, Proceedings of 35th European; Sep. 12-16, 2005 pp. 513-516.

Song, Y.J. et al., "Highly Reliable 256Mb PRAM with Advanced Ring Contact Technology and Novel Encapsulating Technology", VLSI Technology, 2006, Digest of Technical Paper, 2006 Symposium on; pp. 118-119.

U.S. Appl. No. 13/550,091; Non-Final Office Action; Date Filed: Jul. 16, 2012; Date Mailed: Oct. 12, 2012; pp. 1-21.

* cited by examiner

CHEMICAL MECHANICAL POLISHING STOP LAYER FOR FULLY AMORPHOUS PHASE CHANGE MEMORY PORE CELL

CROSS-REFERENCE TO RELATED APPLICATION

This application is a divisional application of U.S. patent application Ser. No. 12/550,062, filed Aug. 28, 2009, the disclosure of which is incorporated by reference herein in its entirety.

BACKGROUND

The present invention relates to a phase change memory cell, and more specifically, to a chemical mechanical polishing (CMP) stop layer for fully amorphous phase change memory pore cell. By fully amorphous phase change memory pore cell it is meant that the phase change material, which is located within the pore, is completely converted to the amorphous phase leaving no partially crystalline phase change material within the volume of the pore during the reset operation (where the reset operation is the operation which converts the state of the memory cell to the high resistance state).

High temperature data retention is a desirable characteristic for phase change memory. Retention is limited by unintended recrystallization of the amorphized phase change material. Crystallization can occur at an amorphous-crystallize boundary. The absence of an amorphous-crystalline boundary within the phase change material eliminates this cause for data loss. Hence, a phase change memory cell which converts all of the phase change material into the amorphous state during the reset operation will have better data retention characteristics. In phase change memory, data is stored by causing transitions in the phase change material between amorphous and crystalline states using current. Current heats the material causing transitions between the two states. The change from the amorphous state to the crystalline state is a low current operation in comparison to the change from the crystalline state to the amorphous state (which is referred to as a reset current). It is desirable to minimize the reset current.

Figure 1A:
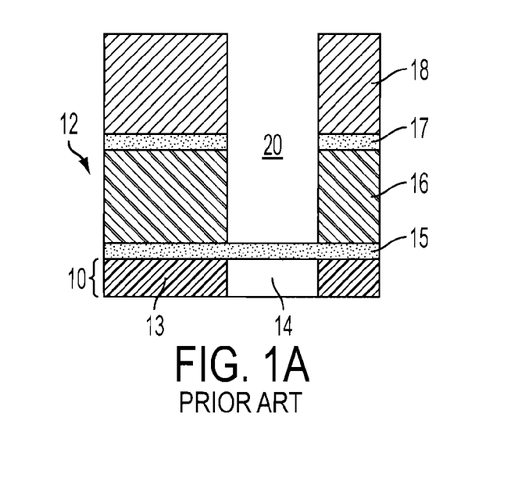
FIGS. 1A through 1I are diagrams illustrating a fabrication method for fabricating a conventional phase change memory pore cell.
Figure 1B:
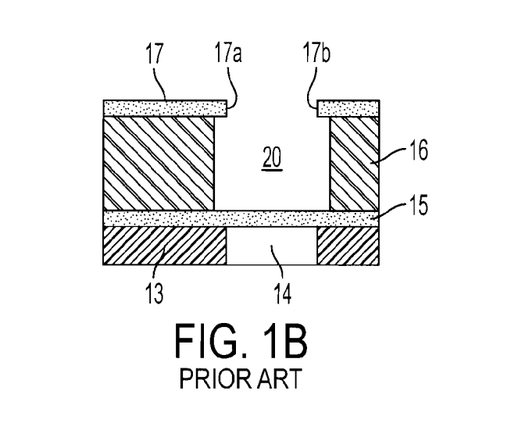
Figure 1C:
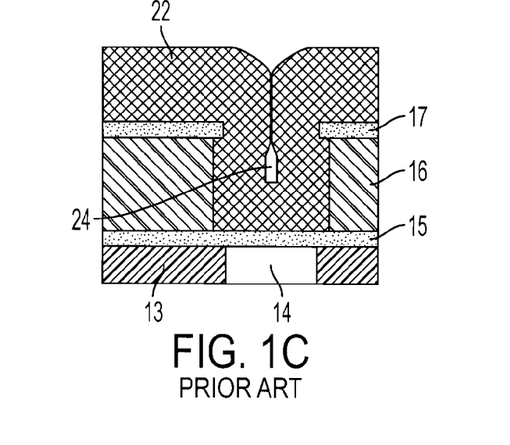
Figure 1D:
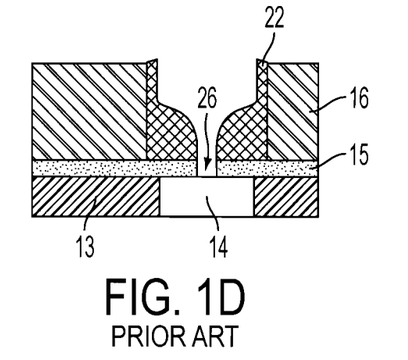
Figure 1E:
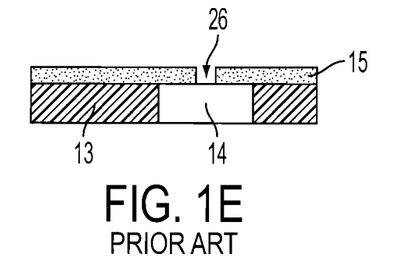
Figure 1F:
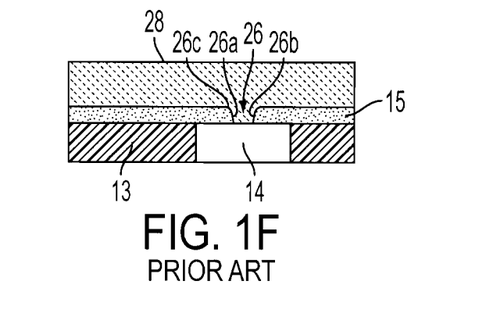
Figure 1G:
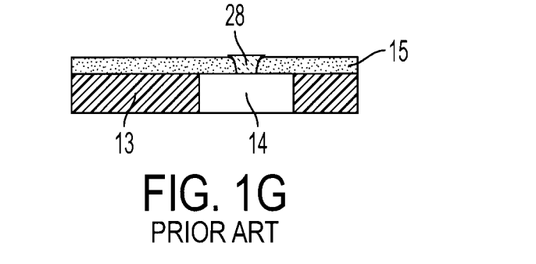
Figure 1H:
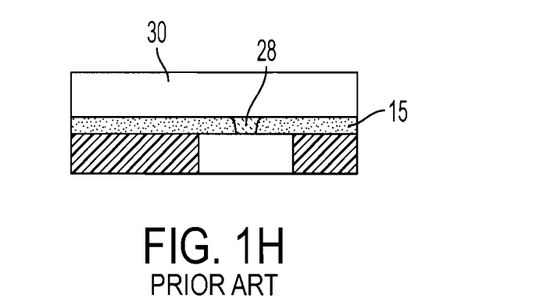
Figure 1I:
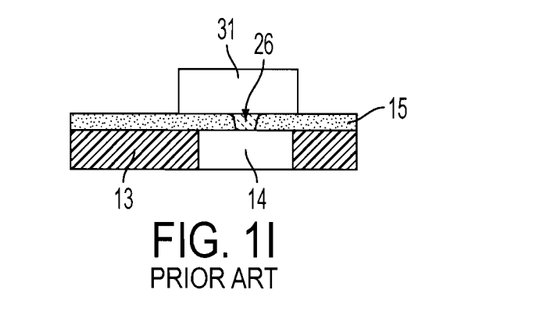

FIGS. 1A through 1I illustrate a method for fabricating a conventional phase change memory pore cell 1. Specifically, FIGS. 1A through 1I illustrate a typical keyhole transfer method. In FIG. 1A, a bottom electrode layer 10 and a memory cell layer 12 on top of the bottom electrode layer 10 are provided. The bottom electrode layer 10 includes a dielectric fill layer 13 and a bottom electrode 14 typically made of tungsten or titanium nitride, within the dielectric fill layer 13. A first dielectric layer 15 is formed on the bottom electrode layer 10 and an isolation layer 16 is formed on the first dielectric layer 15, and a second dielectric layer 17 is formed on the isolation layer 16. A photo resist layer 18 is formed over the second dielectric layer 17. A via 20 is formed to extend to the first dielectric layer 15. In FIG. 1B, the photo resist layer 18 is removed and the isolation layer 16 is recessed, creating overhang portions 17a and 17b of the second dielectric layer 17. In FIG. 1C, a conformal film 22 is deposited within the via 20 and pinched to form a void (i.e., a keyhole structure 24) in a lower region of the via 20. In FIG. 1D, the conformal film 22 is recessed and the keyhole structure 24 is transferred down into the first dielectric layer 15 to form a pore 26. In FIG. 1E, the isolation layer 16, the second dielectric layer 17 and the conformal film 22 are removed thereby exposing the pore 26 formed within the first dielectric layer 15. In FIG. 1F, phase change material 28 is deposited over the first dielectric layer 15 and filled in the pore 26. Next, in FIG. 1G, a planarizing process is performed to remove the phase change material 28 formed outside of the pore 26. Next, in FIG. 1H, a top electrode layer 30 is then formed over the first dielectric layer 15. In FIG. 1I, the top electrode layer 30 is then etched to form a top electrode 31 which is in electrical communication with the pore 26 and the bottom electrode 14.

There are several problems associated with the fabrication method shown in FIGS. 1A through 1I. For example, after the pore 26 is etched and the isolation layer 16, the second dielectric layer 17, and the conformal film 22 are removed, in order to ensure sufficient electrical conduction between the phase change material 28 and the bottom electrode 14, a sputtering process is utilized prior to the phase change material 28 deposition. As shown in FIG. 1F, the sputtering process increases a taper angle 26a and 26b and rounded top corners 26c of the pore 26. The more rounded the pore 26, the higher the reset current required in order to make the phase change memory pore cell 1 fully amorphous. If the pore 26 is too rounded then the cell 1 may fail to become fully amorphous.

SUMMARY

The present invention provides a phase change memory pore cell and method for fabricating the same whereby a sacrificial layer acts as a layer which absorbs the effect of the pore corner rounding caused by a sputtering process performed prior to performing phase change material deposition, and serves as a controllable CMP stopping layer. Thus, the present invention provides an improved phase change memory pore structure.

According to one embodiment of the present invention, a method for fabricating a phase change memory pore cell is provided. The method includes forming a bottom electrode, forming a dielectric layer on the bottom electrode, and forming a sacrificial layer on the dielectric layer. The method further includes selectively etching portions of the sacrificial layer and the first dielectric layer to define a pore extending through the sacrificial layer and the dielectric layer, depositing phase change material on the sacrificial layer and into the pore and removing the phase change material formed outside the pore, removing the sacrificial layer to expose the pore, the pore being vertically aligned, and forming a top electrode over the pore.

According to another embodiment of the present invention, a phase change memory pore cell is provided. The phase change memory pore cell includes a bottom electrode layer comprising a bottom electrode and a memory cell layer formed on top of the bottom electrode layer. The memory cell layer includes a dielectric layer formed over the bottom electrode layer, and a top electrode formed over the dielectric layer, the top electrode being spaced apart from the bottom electrode. The dielectric layer including a pore being vertically aligned and bounded by the top electrode and the bottom electrode, the pore is in electrical communication with the top electrode and the bottom electrode and comprises phase change material switchable between electrical property states.

According to another embodiment of the present invention, a phase change memory device is provided. The phase change memory device includes one or more phase change memory elements, a bottom electrode in contact with each of the one or more phase change memory elements, and a top electrode in contact with each of the one or more phase change memory elements and being spaced apart from the bottom electrode. Each phase change memory element includes a dielectric layer formed over the bottom electrode, the dielectric layer including a pore being vertically aligned and bounded by the top electrode and the bottom electrode, the pore is in electrical communication with the top electrode and the bottom electrode and includes phase change material switchable between electrical property states.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 2A:
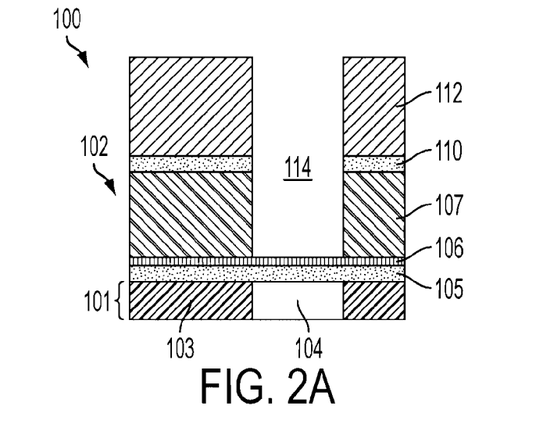
FIGS. 2A through 2J are diagrams illustrating a fabrication method for fabricating a phase change memory pore cell that can be implemented within embodiments of the present invention.

With reference now to FIGS. 2A through 2J, the present invention provides a fabrication method for fabricating a phase change memory pore cell 100 according to an embodiment of the present invention. In FIG. 2A, the memory pore cell 100 includes a bottom electrode layer 101 and a memory cell layer 102 on top of the bottom electrode layer 101. The bottom electrode layer 101 includes a dielectric fill layer 103 typically made of silicon dioxide and a bottom electrode 104 typically made of tungsten (W) or titanium nitride (TiN) within the dielectric fill layer 103. The memory cell layer 102 includes a first dielectric layer 105 (i.e. a separation layer) on an upper surface of the bottom electrode layer 101. The first dielectric layer 105 may be made of silicon nitride and is formed using conventional thin film deposition techniques. The present invention is not limited to using silicon nitride, and other dielectric materials may be used such as silicon dioxide. A sacrificial layer 106 is formed on the first dielectric layer 105. According to an embodiment of the present invention, the sacrificial layer 106 may be formed of a dielectric material such as silicon nitride formed at a 200 degrees Celsius process temperature. The sacrificial layer 106 is of a predetermined thickness ranging from approximately 10 nm to approximately 50 nm. The present invention is not limited to silicon nitride and other dielectrics may be used such as silicon or silicon dioxide.

An isolation layer 107 comprising silicon dioxide is formed on the sacrificial layer 106, and a second dielectric layer 110 is formed on the isolation layer 107. The second dielectric layer 110 is made of silicon nitride, for example. A photo resist layer 112 is formed over the second dielectric layer 110. Next, a via 114 is formed by a lithography process through the photo resist layer 112, the second dielectric layer 110, the isolation layer 107 to the sacrificial layer 106, such that the via 114 extends over the bottom electrode 103. The sacrificial layer 106 acts as an etch stop layer during this operation. The bottom electrode 103 extends through the dielectric fill layer 102 to an isolation device such as a transistor or diode type isolation device (not shown). As shown in the current embodiment, the first dielectric layer 105 is a single separation layer however the first dielectric layer 105 may include two layers according to an alternative embodiment of the present invention.

Figure 2B:
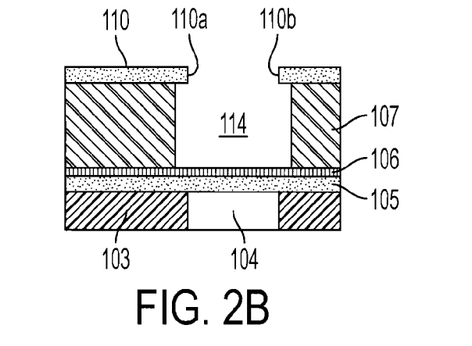

FIG. 2B illustrates the next stage of the fabrication process. Specifically, FIG. 2B is a diagram illustrating a recess operation of the isolation layer 107 of the phase change memory pore cell that can be implemented within embodiments of the present invention. In FIG. 2B, the photo resist layer 112 is removed and the isolation layer 107 is recessed (i.e., etched back with respect to the second dielectric layer 110 using a selective etching process such as applying dilute BOE or hydrofluoric acid to remove the silicon dioxide, thereby creating overhang portions 110a and 110b of the second dielectric layer 110. The photo resist layer 112 is removed using typically stripping techniques.

Figure 2C:
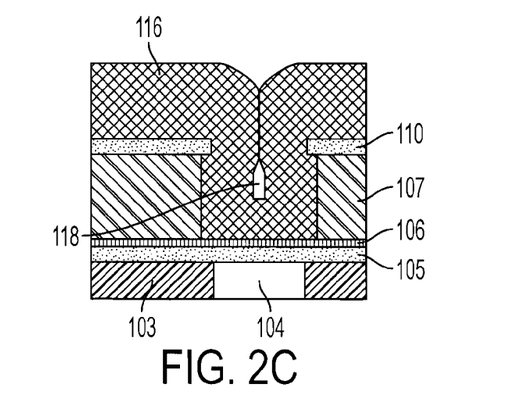

FIG. 2C illustrates the next stage of the fabrication process. Specifically, FIG. 2C is a diagram illustrating the deposition of a conformal film within the phase change memory pore cell that can be implemented within embodiments of the present invention. As shown in FIG. 2C, a conformal film 116 comprising amorphous silicon is formed within the via 114 using chemical vapor deposition (CVD) and pinched to form a void (i.e., a keyhole structure 118) in a lower region of the via 114. The size of the keyhole structure 118 is dependent upon the amount by which the isolation layer 107 is recessed with respect to the second dielectric layer 110. Other procedures such as atomic layer deposition, physical layer deposition, low-pressure chemical vapor deposition (LPCVD) or high density plasma chemical vapor deposition (HDPCVD) may be used to deposit the conformal film 116.

Figure 2D:
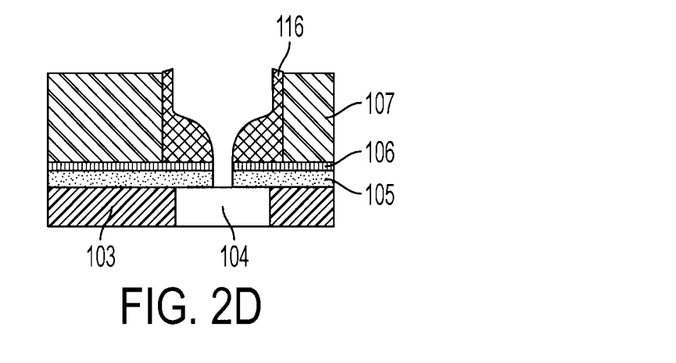

In FIG. 2D, the conformal film 116 is recessed using a reactive ion etching (RIE) process and the keyhole structure 118 is transferred down into the first dielectric layer 105 to form a pore 120. That is, the conformal film 116 has an opening which is determined by the width of the keyhole structure 118. As shown, the first dielectric layer 105 is etched using the conformal film 116, thereby exposing an upper surface of the bottom electrode 103.

Figure 2E:
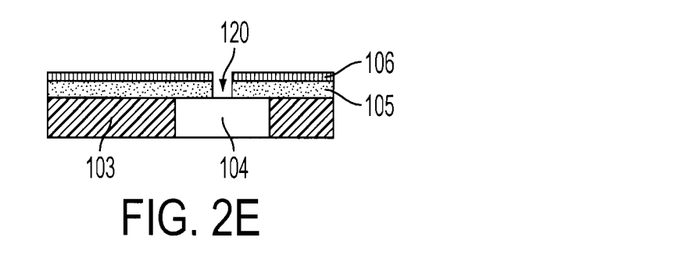

In FIG. 2E, the isolation layer 107 and the conformal layer 116 are removed via a wet etch process. Thus, exposing the pore 120 formed within the sacrificial layer 106 and the first dielectric layer 105. As shown in FIG. 2E, after removing the isolation layer 107, the second dielectric layer 110 and the conformal layer 116, the pore 120 is of a height corresponding to the sum of the height of the sacrificial layer 106 and the first dielectric layer 105.

Figure 2F:
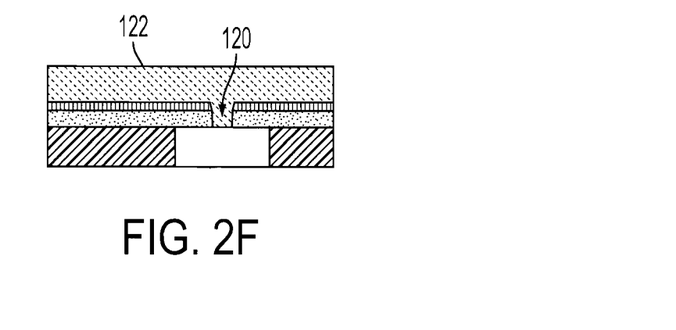

FIG. 2F is a diagram illustrating a deposition operation of phase change material in the phase change memory pore cell that can be implemented within embodiments of the present invention. Prior to electrodepositing phase change material 122, a sputtering process is performed to ensure sufficient electrical conduction between the phase change material 122 and the bottom electrode 103. As a result of the sputtering process, according to an embodiment of the present invention, the rounding of top corners and tapered angles are found in the sacrificial layer 106 instead of the first dielectric layer 105. Therefore, according to an embodiment of the present invention, the sacrificial layer 106 acts as a layer which absorbs the effect of the pore corner rounding which can be caused by the sputtering process. As shown in FIG. 2F, phase change material 122 is deposited over the sacrificial layer 106 and filled in the pore 120. The phase change material 122 is material which is switchable between electrical property states by the application of energy. According to an embodiment of the present invention, the phase change material 122 may be made of germanium-antimony-telluride (GeSbTe) or one of alloys of gallium (Ga)/Sb, indium (In)/Sb, In/selenium (Se), Sb/Te, Ge/Te, In/Sb/Te, Ga/Se/Te, Sn/Sb/Te, In/Sb/Ge, silver (Ag)/In/Sb/Te, Ge/Sb/Se/Te, Te/Ge/Sb/sulfur (S). A wide range of alloy compositions may be used.

According to an embodiment of the present invention, the sacrificial layer 106 has a selective wet etch rate compared to the upper masking layers (i.e., the isolation layer 107 and second dielectric layer 110). According to an embodiment of the present invention, the sacrificial layer 106 is formed of silicon nitride (SiN) having a process temperature of approximately 200 degrees Celsius while the first dielectric layer 105 is formed of silicon nitride having a process temperature of approximately 400 degrees Celsius. However the present invention is not limited hereto and may vary accordingly.

Figure 2G:
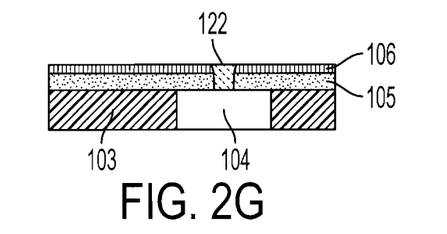

FIG. 2G is a diagram illustrating a planarizing operation performed during fabrication of the phase change memory pore cell that can be implemented within embodiments of the present invention. In FIG. 2G, a planarizing operation (i.e. a first CMP stop process) such as a chemical mechanical polishing (CMP) operation is performed to remove the phase change material 122 outside of the pore 120, leaving the pore 120 filled with phase change material 122. The sacrificial layer 106 acts as a CMP stop layer during the operation. The sacrificial layer 106 is of a material which has a slower CMP rate than the chosen phase change material 122 and a faster CMP rate than the first dielectric layer 105 comprising the pore 120. When both the first dielectric layer 105 and the sacrificial layer 106 comprise silicon nitride, this creates a more robust CMP stop layer.

Figure 2H:
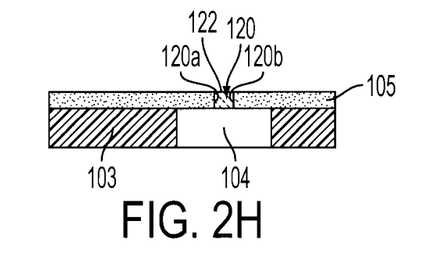

In FIG. 2H, a second CMP stop process is performed to remove the sacrificial layer 106. The second CMP stop process gently polishes away the sacrificial layer 106 and leaving behind the first dielectric layer 105. As shown in FIG. 2H, the pore 120 is vertically aligned which reduces the amount of reset current necessary to change the phase change memory pore cell 100 into a fully amorphous state. According to an embodiment of the present invention, the pore 120 is of a uniform width. The uniform width of the pore 120 is between approximately 1 nm to approximately 40 nm. According to an embodiment of the present invention, the pore 120 includes substantially vertical sidewalls 120a and 120b. According to one embodiment, the angle of each sidewall 120a and 120b ranges from approximately 75 degrees to approximately 90 degrees. As further shown, as a result of the second CMP stop process, the pore 120 is of a same height as that of the first dielectric layer 105. The pore 120 of the present invention has an improved profile i.e., less corner rounding and more vertically aligned than that of the conventional art.

Figure 2I:
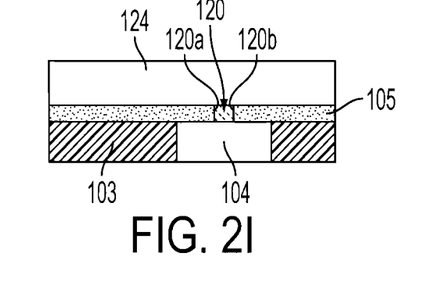
Figure 2J:
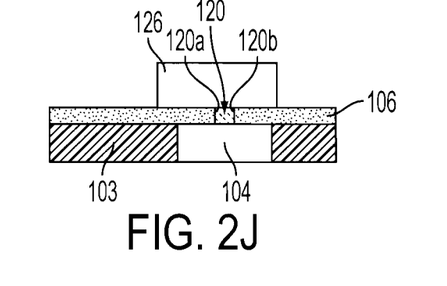

FIG. 2I illustrates the next stage in the fabrication process. Specifically, in FIG. 2I, a top electrode layer 124 is formed over the memory pore cell 100. According to an embodiment of the present invention, the top electrode layer 124 is formed of titanium nitride, for example. In FIG. 2J, the top electrode layer 124 is then patterned for isolation, thereby forming a top electrode 126. The pore 120 is in direct contact with the top electrode 126 and the bottom electrode 103.

The present invention provides a phase change memory pore cell having an improved vertical pore structure as a result of a fabrication method employing a sacrificial layer which acts as a layer that absorbs the affect of the pore corner rounding normally caused by performance of a sputtering operation performed prior to depositing phase change material. Further, the sacrificial layer also serves as a controllable CMP stopping layer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a phase change memory pore cell, the method comprising:
    forming a bottom electrode;
    forming a dielectric layer on the bottom electrode;
    forming a sacrificial layer on the dielectric layer;
    selectively etching through portions of the sacrificial layer and the dielectric layer so as to define a pore extending through the sacrificial layer and the dielectric layer;
    depositing phase change material on the sacrificial layer and into the pore and removing the phase change material formed outside of the pore;
    removing the sacrificial layer to expose the pore, the pore being vertically aligned; and
    forming a top electrode over the pore.

2. The method of claim 1, wherein the sacrificial layer acts as a chemical mechanical polishing stop layer when removing the phase change material outside of the pore.

3. The method of claim 2, wherein the dielectric layer is formed of silicon nitride, the sacrificial layer is formed of silicon nitride, and the isolation layer is formed of silicon dioxide.

4. The method of claim 3, wherein the sacrificial layer is formed of silicon nitride having a process temperature of about 200 degrees Celsius while the dielectric layer is formed of silicon nitride having a process temperature of about 400 degrees Celsius.

5. The method of claim 4, wherein the sacrificial layer is removed via a chemical mechanical polishing operation, the sacrificial layer having a slower chemical mechanical polishing rate than the phase change material and a faster chemical mechanical rate than the dielectric layer comprising the pore.

6. The method of claim 1, wherein the pore is in direct contact with the top electrode and the bottom electrode.

7. The method of claim 6, wherein the pore is of a uniform width of about 1 nanometer (nm) to about 40 nm.

8. The method of claim 7, wherein the pore includes substantially vertical sidewalls, each sidewall having an angle of ranging from about 75 degrees to about 90 degrees.

9. A phase change memory pore cell comprising:
a bottom electrode layer comprising a bottom electrode; and
a memory cell layer formed on top of the bottom electrode layer, the memory cell layer comprising:
a dielectric layer formed over the bottom electrode layer,
a top electrode formed over the dielectric layer, the top electrode being spaced apart from the bottom electrode;
the dielectric layer including a pore being vertically aligned and bounded by the top electrode and the bottom electrode, the pore is in electrical communication with the top electrode and the bottom electrode and comprises phase change material switchable between electrical property states; and
wherein the pore is of a uniform width, has substantially vertical sidewalls and a same height as that of the dielectric layer.

10. The phase change memory pore cell of claim 9, wherein the pore is in direct contact with the top electrode and the bottom electrode.

11. The phase change memory pore cell of claim 9, wherein the uniform width of the pore is between approximately 1 nm and approximately 40 nm.

12. The phase change memory pore cell of claim 10, wherein each sidewall has an angle ranging from approximately 75 degrees to approximately 90 degrees.

13. A memory device comprising:
one or more phase change memory elements;
a bottom electrode in contact with each of the one or more phase change memory elements; and
a top electrode in contact with each of the one or more phase change memory elements and being spaced apart from the bottom electrode,
each phase change memory element comprising:
a dielectric layer formed over the bottom electrode, the dielectric layer including a pore being vertically aligned and bounded by the top electrode and the bottom electrode, the pore is in electrical communication with the top electrode and the bottom electrode and comprises phase change material switchable between electrical property states; and
wherein the pore is of a uniform width, has substantially vertical sidewalls and a same height as that of the dielectric layer.

14. The phase change memory device of claim 13, wherein the pore is in direct contact with the top electrode and the bottom electrode.

15. The phase change memory device of claim 13, wherein the uniform width of the pore is between approximately 1 nm and approximately 40 nm.

16. The phase change memory device of claim 14, wherein each sidewall has an angle of ranging from approximately 75 degrees to approximately 90 degrees.

* * * * *